(12) United States Patent
Sadowski

(10) Patent No.: US 9,183,898 B2
(45) Date of Patent: Nov. 10, 2015

(54) MULTIPLE DATA RATE WIRING AND ENCODING

(75) Inventor: Greg Sadowski, Cambridge, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 995 days.

(21) Appl. No.: 13/293,678

(22) Filed: Nov. 10, 2011

(65) Prior Publication Data

US 2013/0121383 A1    May 16, 2013

(51) Int. Cl.
*H04B 3/36*    (2006.01)
*G11C 7/10*    (2006.01)

(52) U.S. Cl.
CPC .............. *G11C 7/106* (2013.01); *G11C 7/1066* (2013.01); *G11C 7/1012* (2013.01); *G11C 7/1045* (2013.01); *G11C 7/1072* (2013.01)

(58) Field of Classification Search
CPC .... G11C 7/1066; G11C 7/1051; G11C 7/106; G11C 7/1072; H04L 25/20; H04L 25/242; H03K 19/1737; H03K 5/133; G06F 13/4072
USPC .......................................... 375/211, 213, 214
See application file for complete search history.

(56) References Cited

U.S. PATENT DOCUMENTS

| | | | | |
|---|---|---|---|---|
| 6,782,486 | B1* | 8/2004 | Miranda et al. ............... | 713/601 |
| 7,135,899 | B1* | 11/2006 | Sancheti et al. ............... | 327/144 |
| 7,661,010 | B2* | 2/2010 | DeFazio et al. ............... | 713/500 |
| 7,787,326 | B1* | 8/2010 | Sharpe-Geisler et al. ......................... | 365/233.12 |
| 7,983,288 | B2* | 7/2011 | Lee ............................... | 370/419 |
| 8,514,994 | B1* | 8/2013 | Lee ............................... | 375/355 |
| 2005/0122239 | A1* | 6/2005 | Walker ............................ | 341/56 |
| 2008/0112507 | A1* | 5/2008 | Smith et al. .................... | 375/308 |

OTHER PUBLICATIONS

Altera "10. Implementing Double Data Rate I/O Signaling in Cyclone Devices", May 2008.*

* cited by examiner

*Primary Examiner* — Sophia Vlahos
(74) *Attorney, Agent, or Firm* — Volpe and Koenig, P.C.

(57) ABSTRACT

A method and apparatus for using multiple data rate (MDR) wiring with encoding is described herein. Single data rate wires are replaced with MDR wires and signals are processed through MDR circuitry. The MDR circuitry may include MDR driver circuitry, MDR repeater circuitry and MDR receiver/decoder circuitry. An encoding circuit may be included in the MDR circuitry to mitigate power consumption due to signal toggling rates. The MDR circuitry may be implemented at multiple clock rates, and with source synchronous bus circuitry and clock gates.

18 Claims, 14 Drawing Sheets

| sig1 vs. sig2 | Waveforms | | SDR power | DDR power |
|---|---|---|---|---|
| Sig1=Sig2=const | SDR signal 1<br>SDR signal 2<br>DDR signal 1 & 2 | High<br>High<br>High | 2*zero | zero |
| Sig1=~Sig2=const | SDR signal 1<br>SDR signal 2<br>DDR signal 1 & 2 | High<br>Low | 2*zero | max<br>(Idle power issue) |
| Sig1=Sig2 | SDR signal 1<br>SDR signal 2<br>DDR signal 1 & 2 | | 2*P | P<br>(Power reduction) |
| Sig1=~Sig2 | SDR signal 1<br>SDR signal 2<br>DDR signal 1 & 2 | | 2*P | Higher than 2*P<br>(Power increase) |

FIG. 4

| sig1 vs. sig2 | Waveforms | SDR power | Encoded-DDR power |
|---|---|---|---|
| Sig1=Sig2=const | SDR signal 1 — High<br>SDR signal 2 — High<br>DDR signal 1 & 2 — Low | 2*zero | zero |
| Sig1=~Sig2=const | SDR signal 1 — High<br>SDR signal 2 — Low<br>DDR signal 1 & 2 — Low | 2*zero | zero |
| Sig1=Sig2 | SDR signal 1<br>SDR signal 2<br>DDR signal 1 & 2 | 2*P | ~zero |
| Sig1=~Sig2 | SDR signal 1<br>SDR signal 2<br>DDR signal 1 & 2 | 2*P | = < 2*P |
| Sig1 switching<br>Sig2 = const | SDR signal 1<br>SDR signal 2 — Low<br>DDR signal 1 & 2 | P | Between P and max |

MULTIPLE DATA RATE WIRING AND ENCODING

FIELD OF INVENTION

The present invention is generally directed to integrated circuits and in particular, to wiring for integrated circuits.

BACKGROUND

Many wires are needed to interconnect electronic and circuit components, modules and the like on integrated circuits, electronic packages and the like. The wiring may be implemented at multiple levels including tiles, within modules, between multiple modules or the like. These wires consume substantial silicon or routing layer area.

SUMMARY OF EMBODIMENTS OF THE INVENTION

A method and apparatus for using multiple data rate (MDR) wiring with encoding is described herein. Single data rate wires are replaced with MDR wires and signals are processed through MDR conversion circuitry. The MDR conversion circuitry may include MDR driver circuitry, MDR repeater circuitry and MDR receiver/decoder circuitry. An encoding circuit may be included in the MDR conversion circuitry to mitigate power consumption due to signal toggling rates. The MDR conversion circuitry may be implemented at multiple clock rates, and with source synchronous bus circuitry and clock gates.

BRIEF DESCRIPTION OF THE DRAWINGS

A more detailed understanding may be had from the following description, given by way of example in conjunction with the accompanying drawings, wherein:

FIG. 4 is an example chart illustrating single data rate and DDR power consumption;

FIG. 7 is an example chart illustrating single data rate and encoded DDR power consumption;

DETAILED DESCRIPTION OF THE EMBODIMENTS

Described herein is a multiple data rate (MDR) conversion circuit and associated method. In general, single data rate (SDR) wires may be replaced with multiple data rate wires to reduce the area consumed by metal wires, (i.e., reducing N wires to 1 wire). This area may be represented by reduced core area or relaxed routing layers or spaces. The signals are encoded to reduce dynamic power consumption resulting from switching signal states, (i.e., toggling rates).

Figure 1:
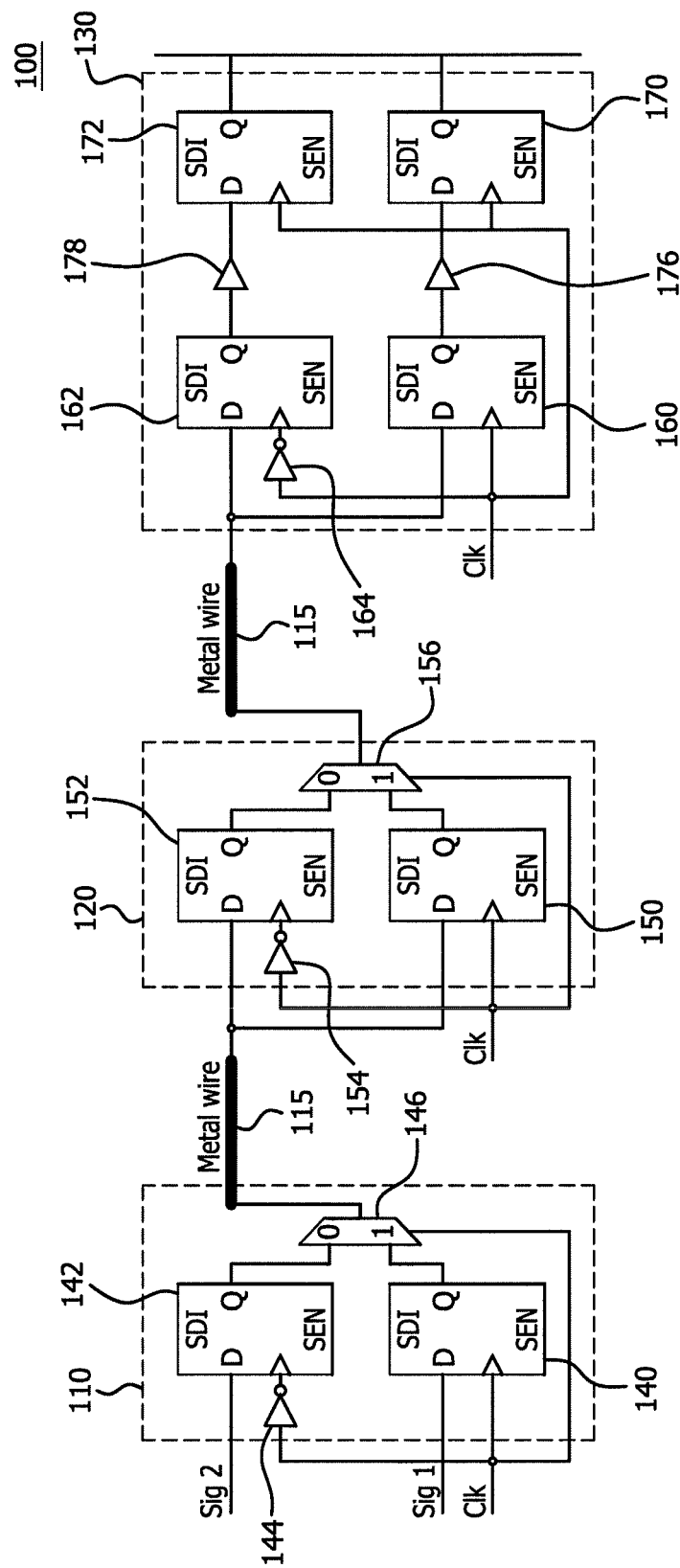
FIG. 1 is an example embodiment of a double data rate (DDR) conversion circuit.

FIG. 1 is an example embodiment of a double data rate (DDR) conversion circuit 100 that may support variable clock frequencies. DDR conversion circuit 100 may include a DDR transmitter/driver circuit 110 coupled or interconnected to a DDR repeater circuit 120 using a DDR wire 115. The DDR wire 115 may be a metal wire or the like. Although one DDR repeater circuit 120 is shown, multiple DDR repeater circuits may be used. The DDR repeater circuit 120 may be coupled or interconnected to a DDR receiver/decoder circuit 130 using a DDR wire 115. The DDR wire 415 may be a metal wire and the like. The term "coupled" as used herein may refer to at least electrical, optical, mechanical or the like connectivity or interconnections and combinations thereof unless specified otherwise.

The DDR transmitter/driver circuit 110 may include a first flip-flop 140 for input signal 1 (Sig1) and a second flip-flop 142 for input signal 2 (Sig2). The number of flip-flops depends on the number of input signals. Flip-flop 140 may have a D input tied to Sig1 and be clocked with a clock signal (Clk). Flip-flop 142 may have a D input tied to Sig2 and be clocked with an inverted Clk via an inverter gate 144. The Q output of flip-flop 140 may be tied to a high input of a multiplexer 146 and the Q output of flip-flop 142 may be tied to a low input of the multiplexer 146. The multiplexer 146 may be clocked with the Clk signal. The output of the multiplexer 146 is tied to a DDR wire 115.

The DDR repeater circuit 120 may include a first flip-flop 150 and second flip-flop 152 for receiving an input signal sent over DDR wire 115 and may be clocked by the Clk and the inverted Clk signals, (via an inverter gate 154), respectively. The Q output of flip-flop 150 may be tied to a high input of a multiplexer 156 and the Q output of flip-flop 152 may be tied to a low input of the multiplexer 156. The multiplexer 156 may be clocked with the Clk signal.

The DDR receiver/decoder circuit 130 may include a first flip-flop 160 and second flip-flop 162 for receiving an input signal sent over wire 115 and may be clocked by the Clk and the inverted Clk signals, (via an inverter gate 164), respectively. The Q output of flip-flop 160 may be tied to a D input of a flip-flop 170 through a delay 176 and the Q output of flip-flop 162 may be tied to a D input of a flip-flop 172 through a delay 178. The flip-flops 170 and 172 may be clocked with the Clk signal. The output of flip-flops 170 and 172 may then be sent to a destination circuit (not shown).

The serial data input (SDI) and scanning enable (SEN) inputs shown on each of the flip-flops in FIG. 1 and the remaining figures described herein indicate that the circuit 100 may be testable.

Operationally and functionally, Sig1 and Sig2 may come from an external circuit (not shown). The flip-flop 142 of DDR transmitter/driver circuit 110 may take Sig2 on the falling edge of the Clk signal, (Clk being tied to an inverter before entering the flip-flop 142), and the flip-flop 140 may take Sig1 on the rising edge of the Clk signal. On the output of the flip-flops 140 and 142, both signals as registered may be sent on one DDR wire 115 by multiplexing the signals using the multiplexer 146. Sig1 may be sent when the Clk is high and Sig 2 may be sent when the Clk signal is low or goes to zero and stays at zero. In an example embodiment, all the Clk signals may be synchronized so that all the Clk signals switch at the same time.

The output signal from the DDR transmitter/driver circuit 110 may arrive at DDR repeater circuit 120 after a delay due to the DDR wire 115. As inferred by the name, DDR repeater circuit 120 is a repeater circuit. As a result of the wire delay and the synchronized clocks, Sig1 may be registered at flip-flop 152 on the falling edge and Sig2 may be registered at flip-flop 150 on the rising edge. This may change again on the next repeater and so forth.

The DDR receiver/decoder circuit 130 may receive the signal from the DDR repeater circuit 120 via the DDR wire 115. The flip-flops 160, 162, 170 and 172 are clocked simultaneously. The flip-flops 160 and 162 may receive one signal on the falling edge and the other one on the rising edge. The flip-flops 170 and 172 may receive both of the signals on the rising edge. At this point, the signals are on an SDR.

The number of DDR repeater circuits 120 used in the DDR conversion circuit 100 may determine the order or position of Sig1 and Sig 2 with respect to flip-flops 170 and 172. Therefore, knowing the number of DDR repeater circuits 120 may be necessary to properly receive the signals at the DDR receiver/decoder circuit 130. If there is an even number of DDR repeater circuits 120, then the signals may output in the order they were input at the DDR transmitter/driver circuit 110. If there are an odd number of DDR repeater circuits 120, then the signals may output in an order opposite to the order they were input at the DDR transmitter/driver circuit 110. In this case, the wires and/or connections at DDR receiver/decoder circuit 130 may have to be swapped. For example, this may be implemented before or after the inverters 176 and 178. The wire swapping may be done at any appropriate connection.

Figure 2:
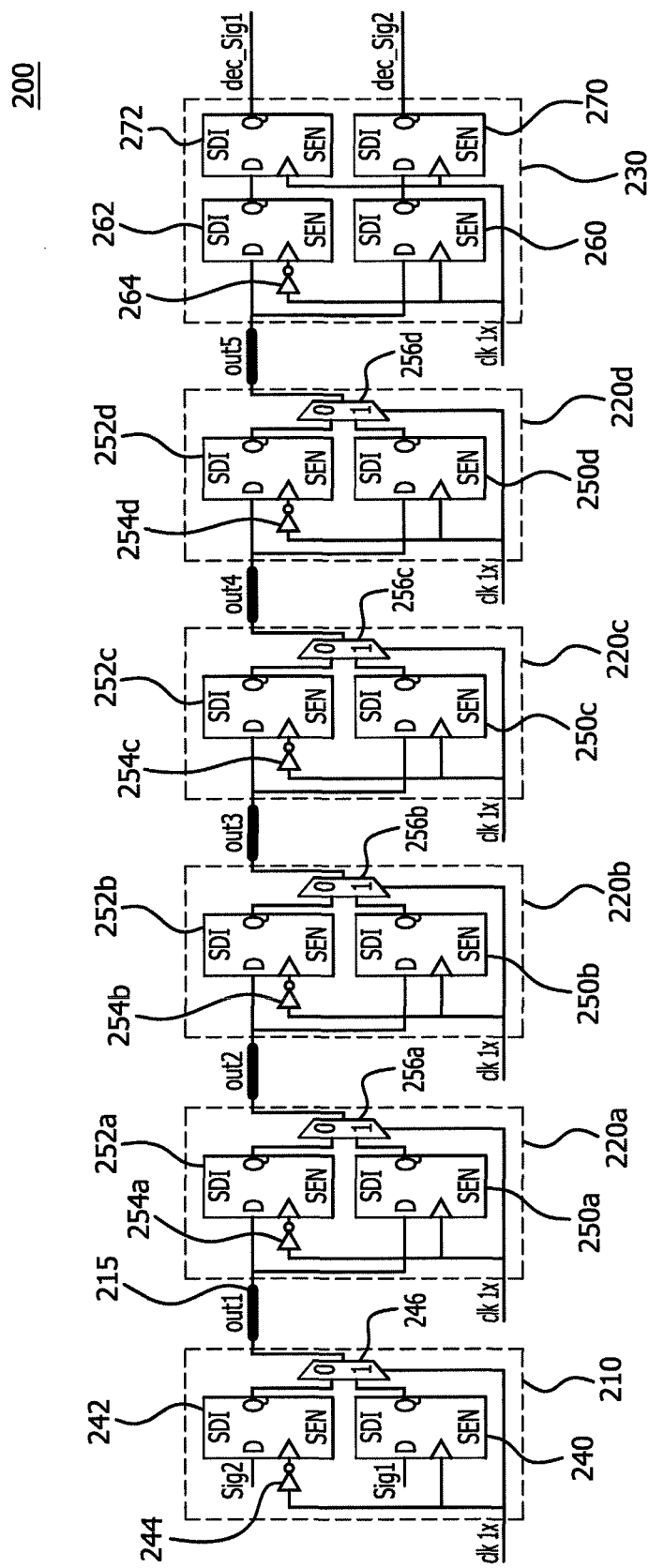
FIG. 2 is an example embodiment of a DDR conversion circuit with four DDR repeaters.

FIG. 2 is an example embodiment of a double data rate (DDR) conversion circuit 200 that includes four DDR repeater circuits. DDR conversion circuit 200 may include a DDR transmitter/driver circuit 210 coupled or interconnected to a DDR repeater circuit 220a using a DDR wire 215. The DDR wire 215 may be a metal wire or the like. The DDR repeater circuit 220a may be coupled to a series of DDR repeater circuits including DDR repeater circuit 220b, 220c and 220d, where each coupling may use a DDR wire 215. The DDR repeater circuit 220d may be coupled to a DDR receiver/decoder circuit 230 using a DDR wire 215.

The DDR transmitter/driver circuit 210 may include a first flip-flop 240 for input signal 1 (Sig1) and a second flip-flop 242 for input signal 2 (Sig2). The number of flip-flops depends on the number of input signals. Flip-flop 240 may have a D input tied to Sig1 and be clocked with a clock signal (Clk1×). Flip-flop 242 may have a D input tied to Sig2 and be clocked with an inverted Clk1× via an inverter gate 244. The Q output of flip-flop 240 may be tied to a high input of a multiplexer 246 and the Q output of flip-flop 242 may be tied to a low input of the multiplexer 246. The multiplexer 246 may be clocked with the Clk1× signal. The output of the multiplexer 246 is tied to the metal wire 215.

Each of the DDR repeater circuits 220a-d may include a first flip-flop 250a-d and a second flip-flop 252a-d, respectively, for receiving an input signal sent over wire 215 and that is clocked by the Clk1× and the inverted Clk1× signals, (via inverter gates 254a-d), respectively. The Q outputs of each flip-flop 250a-d may be tied to a high input of a corresponding multiplexer 256a-d and the Q output of each flip-flop 252a-d may be tied to a low input of the corresponding multiplexer 256a-d. The multiplexers 256a-d may each be clocked with the Clk signal.

The DDR receiver/decoder circuit 230 may include a first flip-flop 260 and a second flip-flop 262 for receiving an input signal sent over wire 215 and may be clocked by the Clk2× and the inverted Clk1× signals, (via an inverter gate 264), respectively. The Q output of flip-flop 260 may be tied to a D input of a flip-flop 270 and the Q output of flip-flop 262 may be tied to a D input of a flip-flop 272. The flip-flops 270 and 272 may be clocked with the Clk1× signal. The output of flip-flops 270 and 272, i.e., decoded signal 1 and decoded signal 2 (dec-Sig1 and dec_Sig2), may then be sent to a destination circuit (not shown). DDR conversion circuit 200 operates and functions similarly to DDR conversion circuit 100.

Figure 3:
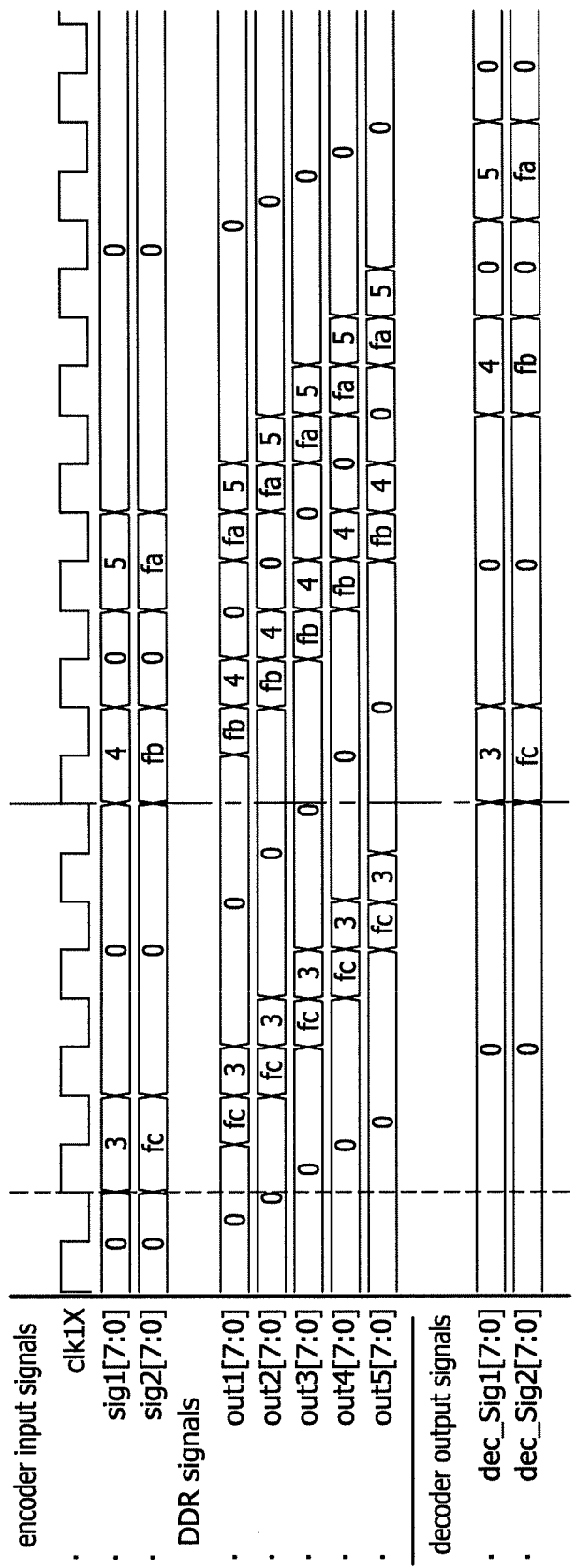
FIG. 3 is an example timing diagram for the DDR conversion circuit with four DDR repeaters.

FIG. 3 is an example timing diagram for DDR conversion circuit 200. As shown, the output from DDR transmitter/driver circuit 210, out1, is a combination of sig1 followed by sig2 based on rising edge and falling edge clocking, respectively. The outputs from each of the DDR repeater circuits 220a-d, out2, out3, out4 and out5, are similarly shifted or delayed versions of out1. The output from the DDR receiver/decoder circuit 230, dec_Sig1 and dec_Sig2, are delayed versions, (by four clock cycles), of sig1 and sig2, respectively. The total delay mentioned above depends on the length of the wires and number of repeaters. The total delay of the system shown in FIG. 3 is 4 clocks. The signals Sig1 and Sig2 signals are shown as 8 bit signals to illustrate the flow of data in the system, but physically they are 2 bits of data: Sig1 is one wire signal representing 1 bit of information and Sig2 is the same.

In the example embodiments above, implementing the SDR to DDR conversion saves at least one SDR wire. Multiple SDR wires may be saved based on an N to 1 conversion. As described herein, by replacing all of the long wires in an example application specific integrated circuit (ASIC) from a SDR to a DDR configuration, 7-8 square millimeters or the like of area may be saved. This is equivalent to 1 computing unit. As a result, the chip may be smaller, and the routing may be relaxed, which lowers the capacitance and power. The area, for example, may be used for additional capabilities on the chip. For illustrative purposes only, the length of the wires being considered may range from 2-12 millimeters long. Other wire lengths may be applicable and may depend on component size, die size and the like.

As described herein, the resulting DDR wire connection may require flip-flop repeaters which drive signal 1 and then signal 2 on the wire based on the rising and falling edge of the clocks. As the result, if the signals are opposite of each other, (i.e., signal 1 is low and signal 2 is high), then the DDR signal may switch every time on each clock edge and the dynamic power in components propagating the DDR signal, (i.e., switching flip-flops, buffers, wire capacitance, and the like), may be at the maximum value even though the static power of signal 1 and signal 1 may be zero. For example, this is the second case in the table shown in FIG. 4.

FIG. 4 shows SDR and DDR dynamic power for different cases of signal 1 and signal 2. The first two cases represent the static case. In the first case, both signals may be high or low. As the DDR conversion circuit starts switching between the two signals, there will be no change from the previous clock cycle to the current clock cycle because they are in the same state. In the first case, the SDR power would be two times zero and the DDR power would be zero. In the second case, the signals are static but have opposite polarity. In the SDR case, the dynamic power is two times zero again but for the DDR case, the dynamic power is maximum power. This is bad because chip statistics indicate that wires are not used that much, (expected wire usage is about 30%), and in this case, wire usage is high. This may not be acceptable.

The remaining two cases further illustrate power consumption under dynamic signal conditions. In the third case, both signals are the same and are changing every clock cycle. In this case, SDR to DDR conversion results in power consumption reduction without the use of any further circuitry or processing. In the fourth case, the signals are in opposite polarity and are changing. In this case, SDR to DDR conversion results in increased power consumption.

Described herein is an encoding method and encoder circuit embodiment for use with the DDR conversion circuit to mitigate power consumption issues due to toggling rates. In accordance with this encoding method, the state of both signals in the current and previous clock cycle are accounted for and then encoded as appropriate.

An example encoding method is shown in Table 1. The example method addresses all possible signal one and signal two combinations with regard to the current clock cycle state versus the previous clock cycle state. The first bit may represent a rising edge signal and the second bit may represent a falling edge signal. This is merely illustrative and other notation or representation may be used. In this example, the code "00" may be used when both signals in the current clock cycle are the same as in the previous clock cycle; the code "11" may be used when both signals in the current clock cycle are different or changed from the previous clock cycle; the code "01 may be used when signal 2 in the current clock cycle has changed from the previous clock cycle; and the code "10" may be used when signal 1 in the current cycle has changed from the previous clock cycle. The encoding scheme above is one of various possibilities that may be matched to the statistical behavior of signal pairs in order to reduce the dynamic power. Similar techniques may be used for a group of N signals.

In particular, code "00" may be used to effectively remove the extra DDR switching when signal 1 and signal 2 are both static and have opposite polarization as shown in FIG. 4 for case 2. This may result in reducing the power consumption for case 2. Moreover, code "11" may be used to remove DDR transitions and thus reduce power when both signal 1 and 2 are switching.

TABLE 1

| code | definition |
|---|---|
| 00 | No change in signal 1 and 2 between a previous clock cycle and a current clock cycle |
| 11 | Signal 1 and 2 both change between a previous clock cycle and a current clock cycle |
| 01 | Signal 1 changes between a previous clock cycle and a current clock cycle |
| 10 | Signal 2 changes between a previous clock cycle and a current clock cycle |

Figure 5A:
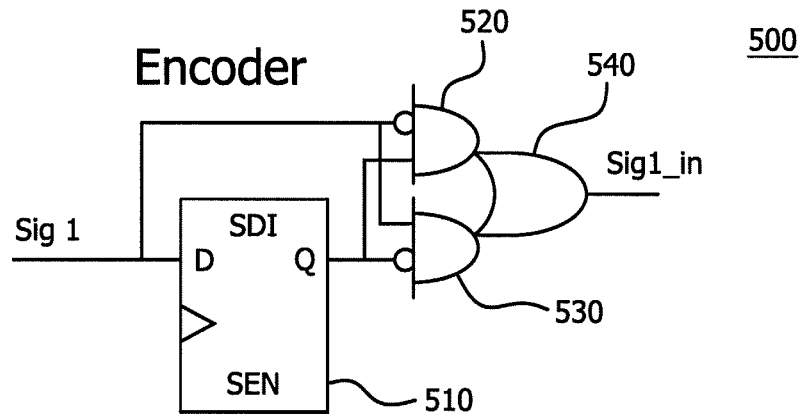
FIG. 5(a) is an example embodiment of an encoder circuit.

FIG. 5(a) is an embodiment of an encoder circuit 500 in accordance with Table 1 that may be used for each input signal in a multiple data rate conversion circuit. The encoder circuit 500 may have a flip-flop 510 that may have a D input tied to signal 1 (Sig1). The output of flip-flop 510 may be tied to one input of AND gate 520 and an inverted version is tied to one input of an AND gate 530. The other input of AND gate 520 is tied to an inverted version of Sig 1 and the other input of AND gate 530 is tied to Sig1. The output of AND gates 520 and 530 are tied to the inputs of OR gate 540, which in turn outputs an encoded signal, Sig1_in. The encoder circuits described herein may be integrated with any of the DDR conversion circuit embodiments described herein. Other variations and embodiments of the encoder circuit may be implemented to reduce or mitigate power consumption in view of signal toggling rates.

Figure 5B:
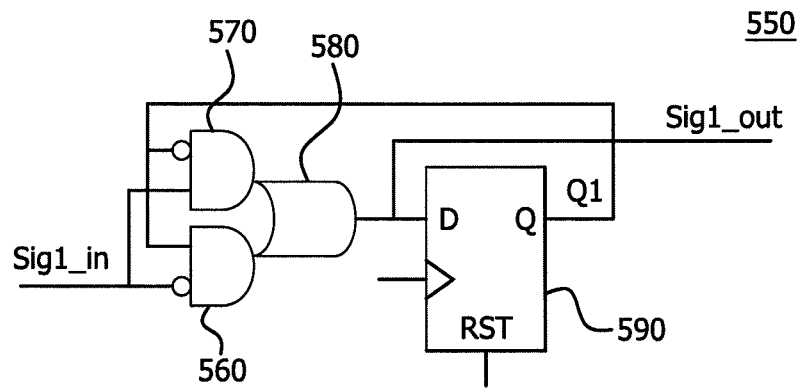
FIG. 5(b) is an example embodiment of an encoder circuit.

FIG. 5(b) is an embodiment of a decoder circuit 550 in accordance with the encoding scheme of Table 1. The decoder circuit 550 may have an AND gate 560 which has an input tied to an inverted Sig1_In signal and another input tied to a Q1 signal. A second AND gate 570 has an input tied to the Sig1_In signal and another input tied to an inverted Q1 signal. The outputs of AND gate 560 and AND gate 570 are tied to an input of an OR gate 580, which has an output tied to a D input of a flip-flop 590. The flip-flop 590 outputs the Q1 signal. The decoder circuits described herein may be integrated with any of the DDR conversion circuit embodiments described herein. Other variations and embodiments of the decoder circuit may be implemented to reduce or mitigate power consumption in view of signal toggling rates.

Table 2 is a truth table which describes a logical basis for the encoder circuit embodiments described above. The truth table summarizes the relationship between the signals involved. In this Table 2, signal 1 and signal 2 represent the current clock cycle state, Q1 and Q2 represent the previous clock cycle state and Sig1_in and Sig2_in represent the encoded signal or output of the encoding circuit. The table presents all of the available combinations of signal 1, signal 2, Q1 and Q2 and the appropriate outputs.

TABLE 2

| Signal 1 | Signal 2 | Q1 | Q2 | Sig1_in | Sig2_in |
|---|---|---|---|---|---|
| 0 | 0 | 0 | 0 | 0 | 0 |
| 0 | 1 | 0 | 1 | 0 | 0 |
| 1 | 0 | 1 | 0 | 0 | 0 |
| 1 | 1 | 1 | 1 | 0 | 0 |
| 0 | 0 | 1 | 1 | 1 | 1 |
| 0 | 1 | 1 | 0 | 1 | 1 |
| 1 | 0 | 0 | 1 | 1 | 1 |
| 1 | 1 | 0 | 0 | 1 | 1 |
| 0 | 0 | 0 | 1 | 0 | 1 |
| 0 | 1 | 0 | 0 | 0 | 1 |
| 1 | 0 | 1 | 1 | 0 | 1 |
| 1 | 1 | 1 | 0 | 0 | 1 |
| 0 | 0 | 1 | 0 | 1 | 0 |
| 0 | 1 | 1 | 1 | 1 | 0 |
| 1 | 0 | 0 | 0 | 1 | 0 |

Figure 6A:
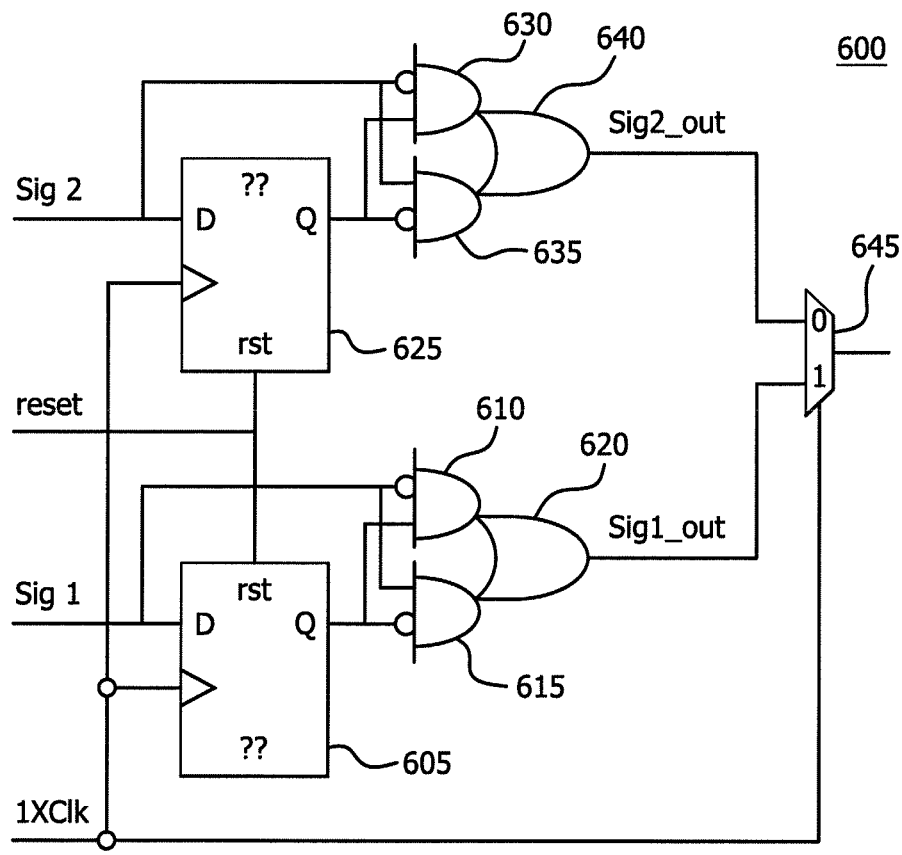
FIG. 6(a) is an example embodiment of a decoder circuit.

FIG. 6(a) is an example embodiment of an encoder circuit 600 in accordance with Table 1 and Table 2 for use with a multiple data rate conversion circuit. The encoder circuit 600 may have a flip-flop 605 having a D input tied to signal 1 (Sig1). The Q output of flip-flop 605 may be tied to one input of an AND gate 610 and an inverted version may be tied to one input of AND gate 615. The other input of AND gate 610 may be tied to an inverted version of Sig 1 and the other input of AND gate 615 may be tied to Sig1. The output of AND gates 610 and 615 may be tied to the inputs of OR gate 620, which in turn outputs an encoded signal, Sig1_in to a multiplexer 645. The encoder circuit may have a second flip-flop 625 having a D input that may be tied to signal 2 (Sig2). The Q output of flip-flop 625 may be tied to one input of AND gate 630 and an inverted version may be tied to one input of AND gate 635. The other input of AND gate 630 may be tied to an inverted version of Sig 2 and the other input of AND gate 635 may be tied to Sig1. The output of AND gates 630 and 635 may be tied to the inputs of OR gate 640, which in turn outputs an encoded signal, Sig2_in to the multiplexer 645. Flip-flops 605 and 625 may be tied to a reset signal. The encoder circuit 600 compares the previous state of the Sig1 and Sig2 to the current state and based on that makes a decision on what the output state 645 is going to be. The previous state of Sig1 is remembered in flip-flop 605 and for Sig2 in flip-flop 625 and the output Q of the flip-flop in the previous state. The flip-flops may need to be reset in order to start with the known previous states for both signals Sig1 and Sig2. The reset is only required at power on of the ASIC. In this embodiment, the flip-flops 610 and 650 and the multiplexer 690 may be clocked by a 1× clock signal (1×Clk).

Table 3 is a truth table which describes a logical basis for the decoder circuit embodiments described above. The truth table summarizes the relationship between the signals involved. In this table, Q1 and Q2 represent the state of the previous decoded signals Sig1 and Sig2, Sig1_in and Sig2_in represent the inputs to the decoder, (or the current clock cycle state from the decoder's perspective), and Sig1_out and Sig2_out represent the output of the decoding circuit. In this embodiment, if Sig1_in and Sig2_in are both equal to zero, then the state of both signals have not changed, (using the encoding scheme shown in Table 1), so the output signals are the same as the previous signals Q1 and Q2. In the case where Sig1 and Sig2 are both equal to a high logic level, then the state of both signals have been inverted and the outputs are inversions of the signals Q1 and Q2. The encoding scheme shown in Table 1 is illustrative and other possible embodiments may be used.

TABLE 3

| Sig1_in | Sig2_in | Q1 | Q2 | Sig1_out | Sig2_out |
|---|---|---|---|---|---|
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 1 | 1 |
| 1 | 1 | 0 | 0 | 1 | 1 |
| 1 | 1 | 0 | 1 | 1 | 0 |
| 1 | 1 | 1 | 0 | 0 | 1 |
| 1 | 1 | 1 | 1 | 0 | 0 |
| 0 | 1 | 0 | 0 | 0 | 1 |
| 0 | 1 | 0 | 1 | 0 | 0 |
| 0 | 1 | 1 | 0 | 1 | 1 |
| 0 | 1 | 1 | 1 | 1 | 0 |
| 1 | 0 | 0 | 0 | 1 | 0 |
| 1 | 0 | 0 | 1 | 1 | 1 |
| 1 | 0 | 1 | 0 | 0 | 0 |
| 1 | 0 | 1 | 1 | 0 | 1 |

Figure 6B:
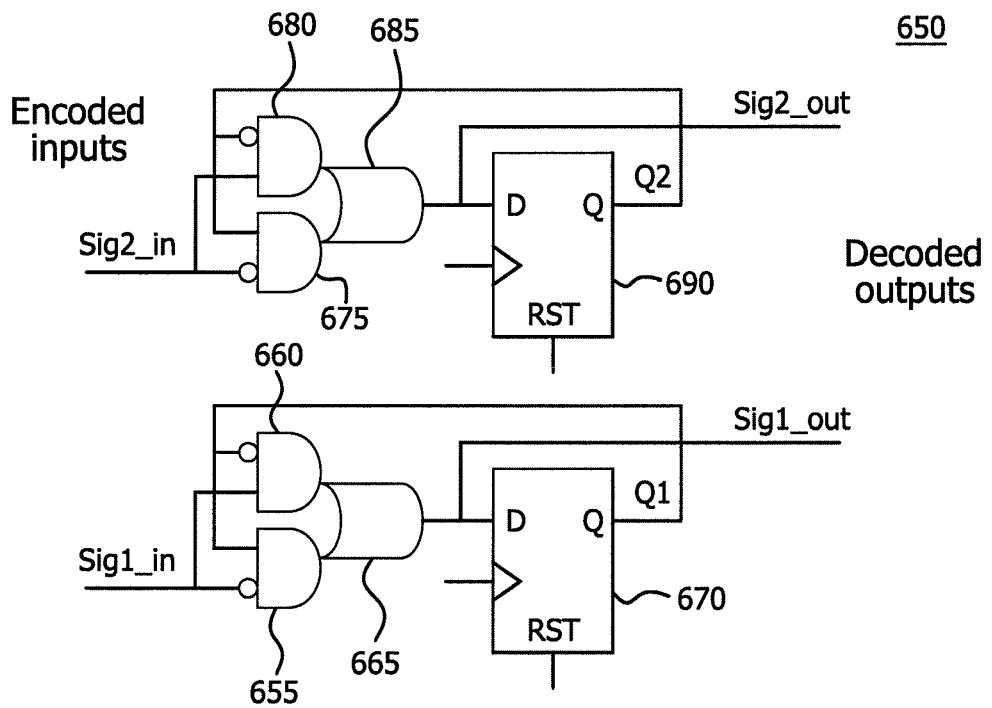
FIG. 6(b) is an example embodiment of a decoder circuit.

FIG. 6(b) is an example embodiment of a decoder circuit 650 in accordance with Table 1 and Table 3 for use with a multiple data rate conversion circuit. For the Sig1_In signal, the encoder circuit 650 may have an AND gate 655 which has an input tied to an inverted Sig1_In signal and another input tied to a Q1 signal. A second AND gate 660 has an input tied to the Sig1_In signal and another input tied to an inverted Q1 signal. The outputs of AND gate 655 and AND gate 660 are tied to an input of an OR gate 665, which has an output tied to a D input of a flip-flop 670. The flip-flop 670 outputs the Q1 signal. For the Sig2_In signal, the encoder circuit 650 may have an AND gate 675 which has an input tied to an inverted Sig2_In signal and another input tied to a Q2 signal. A second AND gate 680 has an input tied to the Sig2_In signal and another input tied to an inverted Q2 signal. The outputs of AND gate 675 and AND gate 680 are tied to an input of an OR gate 685, which has an output tied to a D input of a flip-flop 690. The flip-flop 690 outputs the Q2 signal.

FIG. 7 is an example chart illustrating single data rate and encoded DDR power consumption. The encoding may be performed in accordance with Table 1. The first and second cases are static from a previous clock cycle to a current clock cycle and a "00" code may be used. The third case may use an "11" code and the fifth case may use a "10" code. The fourth case illustrates that the code may change each clock cycle. In this case, an "11" code may be followed by a "00" code, which in turn may be followed by an "11" code. That is, each clock cycle, a determination is made as to which code may be sent.

As shown, in all cases where signals are static, the encoded DDR dynamic power is zero. In the cases where the two signals are exactly the same but changing dynamically each clock cycle, the power is still close to zero. In the other cases, the dynamic power increases with the toggle rate of the input signals. Statistically, signals' toggling rate is usually less (much less) than 100%. In general, the code selected may depend on the statistical behavior of signal one and signal two. Optimal encodings may be determined for each set of wires. The encoding may depend, for example, on how the wires behave as a singular wire.

Figure 8:
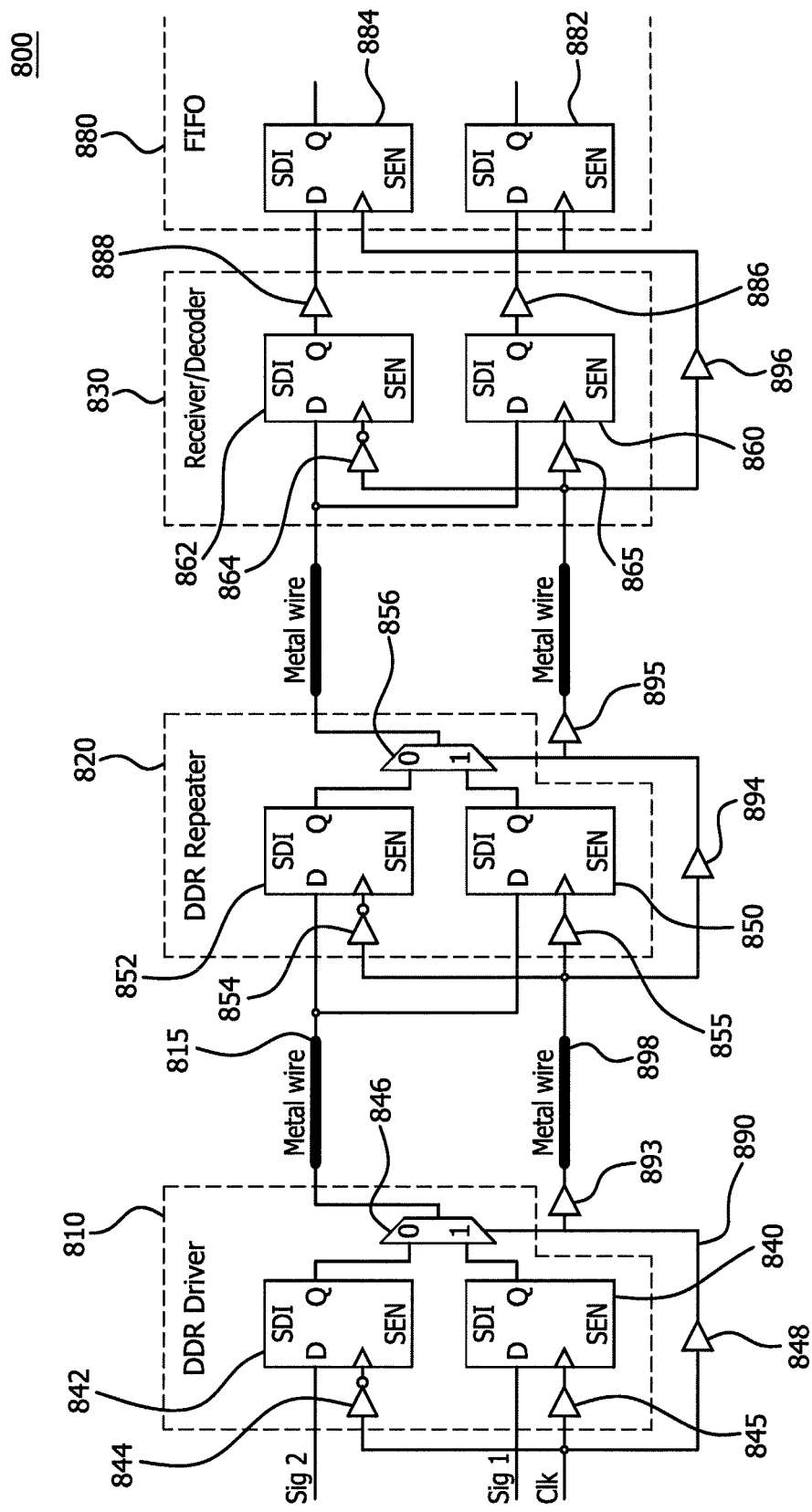
FIG. 8 is an example embodiment of a DDR conversion circuit with a source synchronous bus.

FIG. 8 is an example embodiment of a DDR conversion circuit 800 with a source synchronous bus (SSB). DDR conversion circuit 800 may include a DDR transmitter/driver circuit 810 coupled to a DDR repeater circuit 820 using a DDR wire 815. The DDR wire 815 may be a metal wire or the like. Although one DDR repeater circuit 820 is shown, multiple DDR repeater circuits may be used. The DDR repeater circuit 820 may be coupled to a DDR receiver/decoder circuit 830 using a DDR wire 815. The DDR receiver/decoder 820 may be coupled to a first-in first-out (FIFO) circuit 880. A SSB 890 may be used to send the Clk signal to the DDR repeater circuit 820, DDR receiver/decoder circuit 830 and the FIFO circuit 880.

The DDR transmitter/driver circuit 810 may include a flip-flop 840 for input signal 1 (Sig1) and a flip-flop 842 for input signal 2 (Sig2). The number of flip-flops depends on the number of input signals. Flip-flop 840 may have a D input tied to Sig1 and may be clocked with a clock signal (Clk) via a delay gate 845. Flip-flop 842 may have a D input tied to Sig2 and may be clocked with an inverted Clk via an inverter gate 844. The Q output of flip-flop 840 may be tied to a high input of a multiplexer 846 and the Q output of flip-flop 842 may be tied to a low input of the multiplexer 846. The multiplexer 846 may be clocked with the Clk signal via a delay gate 848. The output of the multiplexer 846 may be tied to the metal wire 815.

The SSB 890 may include delay gates 848 and 893 corresponding to the DDR transmitter/driver circuit 810, delay gates 894 and 895 corresponding to each DDR repeater circuit 820, and a delay gate 896 corresponding to the DDR receiver/decoder circuit 830, where each of the delay gates 892 through 896 are coupled or interconnected via DDR wires 898. In another example embodiment, DDR wires 815 and DDR wires 898 may be the same DDR wires.

The DDR repeater circuit 820 may include a first flip-flop 850 and s second flip-flop 852 for receiving an input signal sent over wire 815 and may be clocked by the Clk signal, (via a delay gate 855) and the inverted Clk signal, (via an inverter gate 854), respectively. The Clk signal may be sent over the SSB 890. The Q output of flip-flop 850 may be tied to a high input of a multiplexer 856 and the Q output of flip-flop 852 may be tied to a low input of the multiplexer 856. The multiplexer 856 may be clocked with the Clk signal sent over the SSB 890.

The DDR receiver/decoder circuit 830 may include a first flip-flop 860 and a second flip-flop 862 for receiving an input signal sent over wire 815 and that may be clocked by the Clk, (via a delay gate 865) and the inverted Clk signals, (via an inverter gate 864), respectively. The Clk signal may be sent over the SSB 890.

The FIFO circuit 880 may include a first flip-flop 882 and a second flip-flop 884. The Q output of flip-flop 860 may be tied to a D input of a flip-flop 882 through a delay 886 and the Q output of flip-flop 862 may be tied to a D input of a flip-flop 884 through a delay 888. The flip-flops 882 and 884 may be clocked with the Clk signal that may be sent over a SSB 890. The Q output of flip-flops 884 and 882 may then be sent to a destination circuit (not shown).

Operationally and functionally, the DDR conversion circuit 800 is similar to the embodiments described hereinbefore but now includes the SSB 890, where the clock signal is sent together with the data. In the embodiment of FIG. 1, the clock signal for the DDR repeater circuit comes from a clock located with the flip-flops comprising the DDR repeater. That is, there is a nearby clock distribution tree or the like. For example, there may be a separate metal layer for the clock and a circuit may connect or tap into the layer. However, this approach wastes a lot of power. For example, at least the top level circuits of a clock distribution tree toggle all the time.

It is preferable for the clock signal to be present at the input of the DDR transmitter/driver circuit to clock signal 1 and signal 2. The clock signal may then be sent with the signal. As a result, the remaining flip-flops, (comprising the DDR repeater circuits and DDR receiver/decoder circuit), may not need to be in the vicinity of the clock tree distribution. This saves power. The clock signal may be sent in the same wires as the data or in separate wires. The signals and the clock travel together across the chip and there is no dependence on clock availability.

As shown in FIG. 8, the DDR receiver/decoder 830 is tied to the FIFO circuit 880. The FIFO circuit 880 may be needed to synchronize the clocks. As shown, the SSB 890 sends the clock signal to each circuit that may require a clock signal. As a result, the clock signals at different circuits may be out of phase due to the distance traveled. The FIFO circuit 880 may be used to synchronize the clocks. The distance between repeaters may be greater than the embodiment in FIG. 1. With SSB, the distance depends only on the relation between the clock and data signals as they are travelling together across the ASIC. In the embodiment of FIG. 1, the distance mainly depends on clock frequency.

Figure 9:
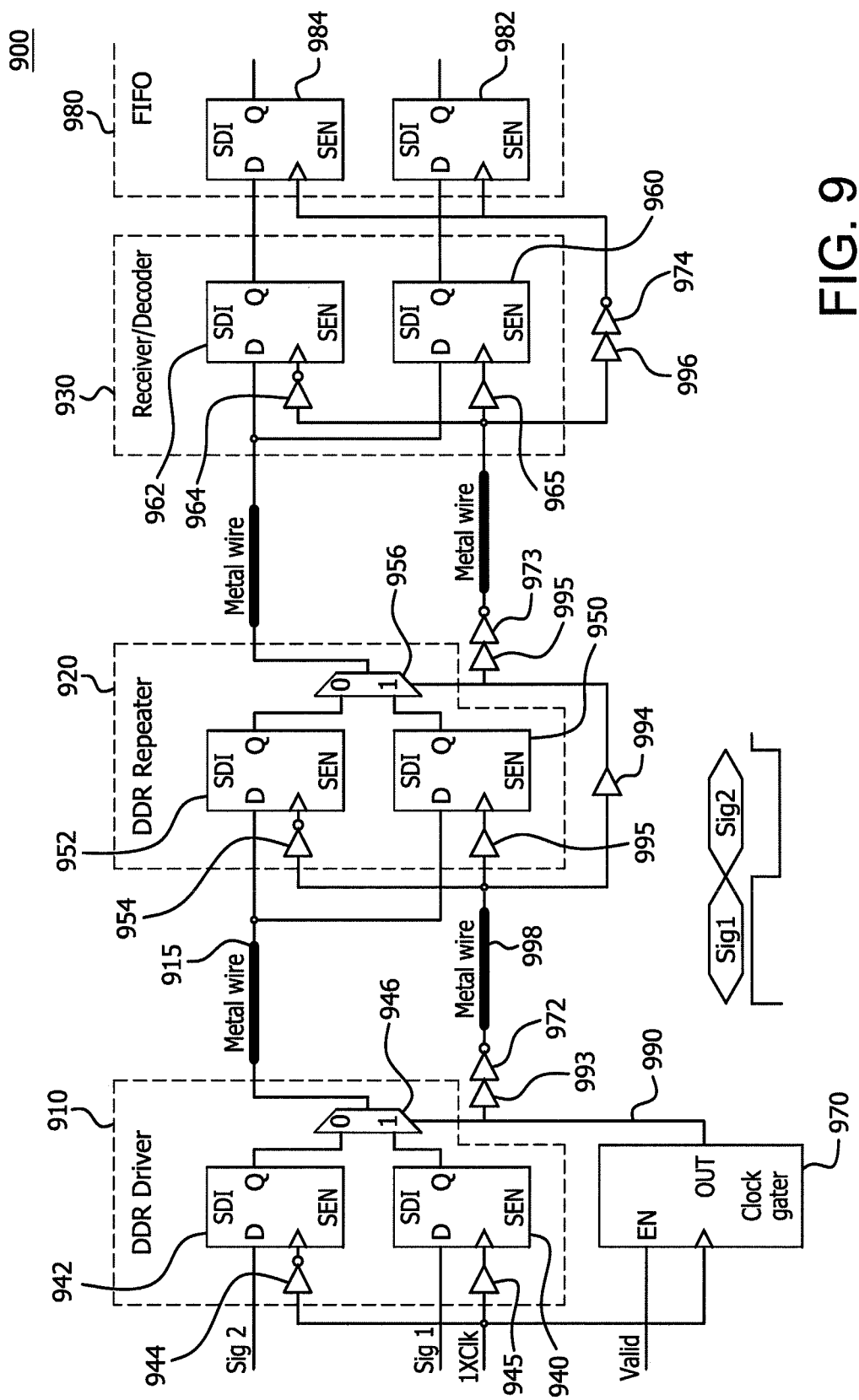
FIG. 9 is an example embodiment of a DDR conversion circuit with a source synchronous bus and a clock gate.

FIG. 9 is an example embodiment of a DDR conversion circuit 900 with a source synchronous bus and a clock gate. In addition to the benefits of SSB as stated hereinbefore, clock gating is introduced to the 1× clock. This results in greater power savings. DDR conversion circuit 900 may include a DDR transmitter/driver circuit 910 coupled to a DDR repeater circuit 920 using a DDR wire 915. The DDR wire 915 may be a metal wire and the like. Although one DDR repeater circuit 920 is shown, multiple DDR repeater circuits may be used. The DDR repeater circuit 920 may be coupled to a DDR receiver/decoder circuit 930 using a DDR wire 915. The DDR receiver/decoder circuit 920 may be coupled to a first-in first-out (FIFO) circuit 980. An SSB 990 may be used to send the Clk signal to the DDR repeater circuit 920, DDR receiver/decoder circuit 930 and the FIFO circuit 980. A clock gate circuit 970 may be coupled to a multiplexer 946 and the SSB 990 and may turn off the clock if the data, (i.e., signal 1 and/or signal 2 are not valid).

The DDR transmitter/driver circuit 910 may include a first flip-flop 940 for input signal 1 (Sig1) and a second flip-flop 942 for input signal 2 (Sig2). The number of flip-flops depends on the number of input signals. Flip-flop 940 may have a D input tied to Sig1 and be clocked with a clock signal (1×Clk) via a delay gate 945. Flip-flop 942 may have a D input tied to Sig2 and be clocked with an inverted 1×Clk via a delay gate 944. The Q output of flip-flop 940 may be tied to a high input of the multiplexer 946 and the Q output of flip-flop 942 may be tied to a low input of the multiplexer 946. The multiplexer 946 may be clocked with the 1×Clk signal via the clock gate 970. The output of the multiplexer 946 may be tied to the metal wire 915.

The clock gate circuit 970 may be a clock gate having an enable input connected to a valid signal and clocked by a 1×Clk signal. The output of the clock gate is tied to the SSB 990 and the multiplexer 946.

The SSB 990 may include a delay gate 993 corresponding to the DDR transmitter/driver circuit 910, delay gates 994 and 995 corresponding to each DDR repeater circuit 920, and a delay gate 996 corresponding to the DDR receiver/decoder circuit 930. The SSB 990 may further include an inverter gate 972 tied between the delay gate 993 and 994 via a DDR wire 998, an inverter gate 973 tied between each delay gate 995 and 996 via a DDR wire 998, and an inverter gate 974 tied to an output of the delay gate 996, so as to delay the clock related to the signal so that the same edge (but inverted) may be used in the next circuit. In another embodiment, the inverter gates may not be used.

The DDR repeater circuit 920 may include a first flip-flop 950 and a second flip-flop 952 for receiving an input signal sent over wire 915 and may be clocked by the 1×Clk signal, (via a delay gate 955) and the inverted Clk signal, (via an inverter gate 954), respectively. The 1×Clk signal may be sent over the SSB 990. The Q output of flip-flop 950 may be tied to a high input of a multiplexer 956 and the Q output of flip-flop 952 may be tied to a low input of the multiplexer 956. The multiplexer 956 may be clocked with the 1×Clk signal sent over the SSB 990.

The DDR receiver/decoder circuit 930 may include a first flip-flop 960 and a second flip-flop 962 for receiving an input signal sent over wire 915 and may be clocked by the 1×Clk, (via a delay gate 965) and the inverted Clk signals, (via an inverter gate 964), respectively. The Clk signal may be sent over the SSB 990.

The FIFO circuit 980 may include a first flip-flop 982 and a second flip-flop 984. The Q output of flip-flop 960 may be tied to a D input of a flip-flop 982 and the Q output of flip-flop 962 may be tied to a D input of a flip-flop 984. The flip-flops 982 and 984 may be clocked with the 1×Clk signal that may be sent over a SSB 990. The output of flip-flops 982 and 984 may then be sent to a destination circuit (not shown).

Operationally and functionally, the DDR conversion circuit 900 is similar to the DDR conversion circuits described hereinbefore but now may include a clock gate circuit 970 which turns off the clock if signal 1 and signal 2 are not valid. This prevents toggling when not needed, giving the best power results.

Figure 10A:
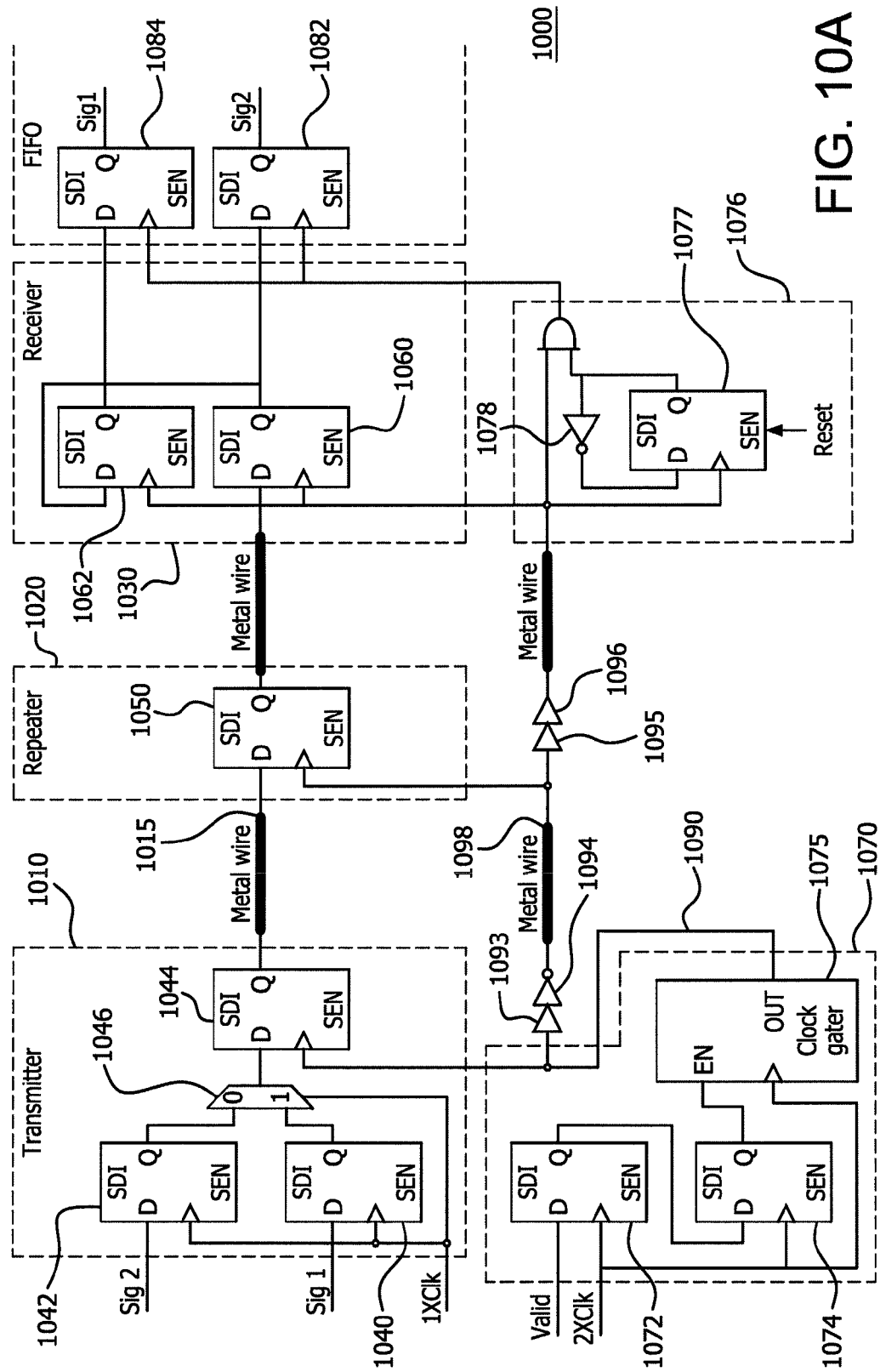
FIG. 10(a) is an example embodiment of a DDR conversion circuit using a 2× clock rate with a source synchronous bus and a clock gate.
Figure 10B:
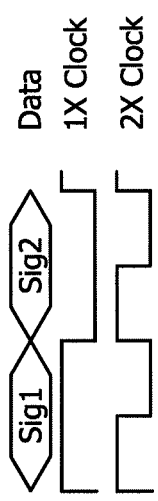
FIG. 10(b) is an example diagram illustrating data, 1× clock and 2× clock signals for the DDR conversion circuit of FIG. 10(a)

FIG. 10(*a*) is an example embodiment of a DDR conversion circuit 1000 using a 2× clock rate with a source synchronous bus and a clock gate and FIG. 10(*b*) is an example diagram illustrating data, 1× clock and 2× clock signals for the DDR conversion circuit 1000 of FIG. 10(*a*). DDR conversion circuit 1000 may include a DDR transmitter/driver circuit 1010 coupled or interconnected to a DDR repeater circuit 1020 using a DDR wire 1015. The DDR wire 1015 may be a metal wire and the like. Although one DDR repeater circuit 1020 may be shown, any number of DDR repeater circuits may be used. The DDR repeater circuit 1020 may be coupled or interconnected to a DDR receiver/decoder circuit 1030 using a DDR wire 1015. The DDR receiver/decoder 1030 may be coupled or interconnected to a first-in first-out (FIFO) circuit 1080, which is clocked by a 1× clock generation circuit 1076. A SSB 1090 may be used to send a 2× clock signal (2×Clk) to the DDR transmitter/driver circuit 1010, DDR repeater circuit 1020, DDR receiver/decoder circuit 1030 and the 1× clock generation circuit 1076. A clock gate circuit 1070 may be coupled or interconnected to a multiplexer 1046 and SSB 1090 and may turn off the clock if the data, i.e., signal 1 and/or signal 2 are not valid.

The DDR transmitter/driver circuit 1010 may include a first flip-flop 1040 for input signal 1 (Sig1) and a second flip-flop 1042 for input signal 2 (Sig2). The number of flip-flops depends on the number of input signals. Flip-flop 1040 may have a D input tied to Sig1 and may be clocked with a 1× clock signal (1×Clk). Flip-flop 1042 may have a D input tied to Sig2 and may be clocked with the 1×Clk. The Q output of flip-flop 1040 may be tied to a high input of a multiplexer 1046 and the Q output of flip-flop 1042 may be tied to a low input of the multiplexer 1046. The multiplexer 1046 may be clocked with the 1×Clk signal. The output of the multiplexer 1046 may be tied to an input of a D input of a flip-flop 1044. The flip-flop 1044 may be clocked by a 2×Clk via the clock gate circuit 1070. A Q output of the flip-flop 1044 may be tied to a DDR wire 1015.

The clock gate circuit 1070 may include a flip-flop 1072 having a D input connected to a valid signal and clocked by a 2×Clk signal. The output of flip-flop 1072 is tied to a D input of a flip-flop 1074, which is also clocked by the 2×Clk. The Q output of the flip-flop 1074 may be tied to an enable input of a clock gate 1075, which is also clocked by the 2×Clk. The output of the clock gate 1075 is tied to the SSB 1090 and the multiplexer 1046.

The SSB 1090 may include delay gates 1093 and 1094 corresponding to the DDR transmitter/driver circuit 1010 and delay gates 1095 and 1096 corresponding to each DDR repeater circuit 1020, where delay gates 1094 and 1095 are coupled or interconnected via DDR wires 1098. Delay gate 1096 may be coupled or interconnected to the 1×Clk generation circuit 1076 via DDR wires 1098.

The DDR repeater circuit 1020 may include a flip-flop 1050 for receiving an input signal sent over wire 1015 and may be clocked by the 2×Clk signal. The Q output of flip-flop 1050 may be coupled or interconnected to the DDR receiver/decoder circuit 1030 via DDR wires 1015. The 2×Clk signal may be sent over the SSB 990.

The DDR receiver/decoder circuit 1030 may include a flip-flop 1060 for receiving an input signal sent over wire 1015 and may be clocked by the 2×Clk signal. The 2×Clk signal may be sent over the SSB 990. The Q output of the flip-flop 1060 is tied to a D input of a flip-flop 1062, which is also clocked by the 2×Clk signal.

The FIFO circuit 1080 may include a flip-flop 1082 and a flip-flop 1084. The Q output of flip-flop 1060 may be tied to a D input of a flip-flop 1082 and the Q output of flip-flop 1062 may be tied to a D input of a flip-flop 1084. The flip-flops 1082 and 1084 may be clocked with the 1×Clk signal that may be sent by the clock generation circuit 1076. The output of flip-flops 1082 and 1084 may then be sent to a destination circuit (not shown).

The clock generation circuit 1076 may include a flip-flop 1077 having a D input tied to a Q output of the flip-flop 1077 via an inverter gate 1078. The flip-flop 1077 is clocked by the 2×Clk signal and may have an input for a reset signal. The Q output of the flip-flop 1077 is also tied to an AND gate 1079, which has another input tied to the 2×Clk signal. The clock generation circuit 1076 ensures that the FIFO circuit 1080 has the right clock signal. As a result of using the 2×Clk signal, the number of flip-flops used may need to be counted. If the number of repeaters (flip-flops) is not odd, then the Sig1 signal may need to be swapped with Sig2 signal at the output. The clock generation circuit 1076 generates the 1× clock to take the data at the right time. The clock generation circuit 1076 is configured as a divide by two circuit using the D and Q input ports.

Operationally and functionally, the DDR conversion circuit 1000 is similar to the DDR conversion circuits described above but features a 2× clock, a gate clock and SSB. As a result, the DDR repeater circuit 1020 may now include one flip-flop instead of two. This may be important for long distances when many repeaters or long wires may be needed. The reduced number of flip-flops will save area. In this embodiment and other embodiments using a 2× clock signal, the inter-repeater distance may be greater with a 2× clock signal and less DDR repeater circuits may be used. In this instance, instead of using falling and rising edges of the same clock from a 1× clock signal, the rising edge of a 2× clock signal may be used for all clocking.

The 2× clock signal may be provided by an external circuit or may be generated using the 1× clock signal. An embodiment for generating the 2×Clk signal is described below with respect to FIG. 11.

Selection of the DDR conversion circuit may depend on the length of wires being used. For example, long wire lengths may use the embodiment of FIG. 10(*a*) and short wire lengths may use the embodiment of FIG. 9. Other embodiments described herein may be used accordingly.

Figure 11:
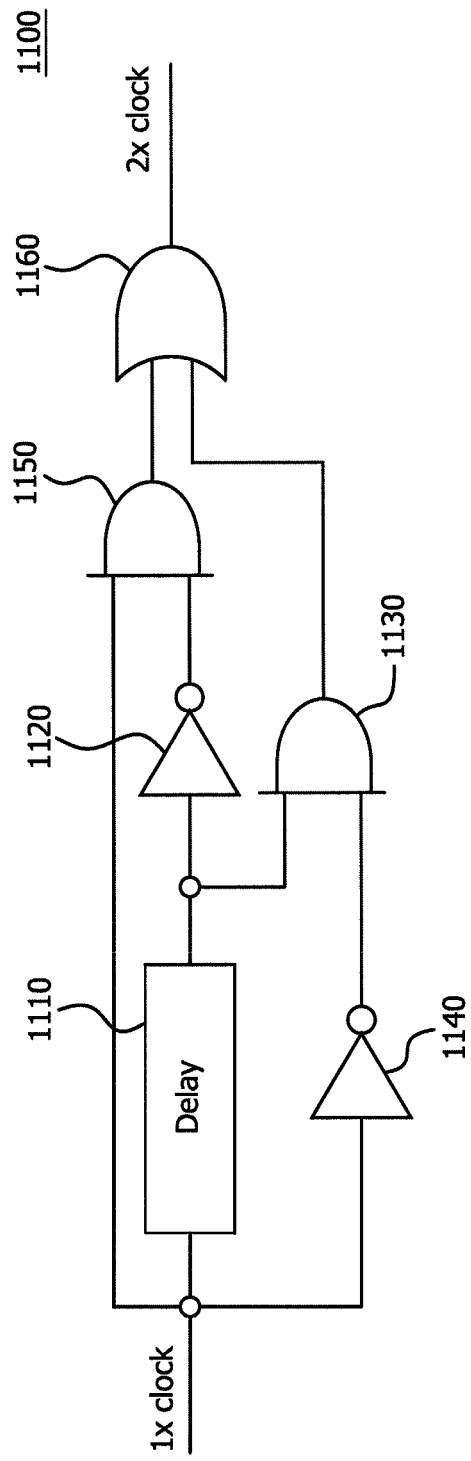
FIG. 11 is an example embodiment of a 2× clock generating circuit.
Figure 12:
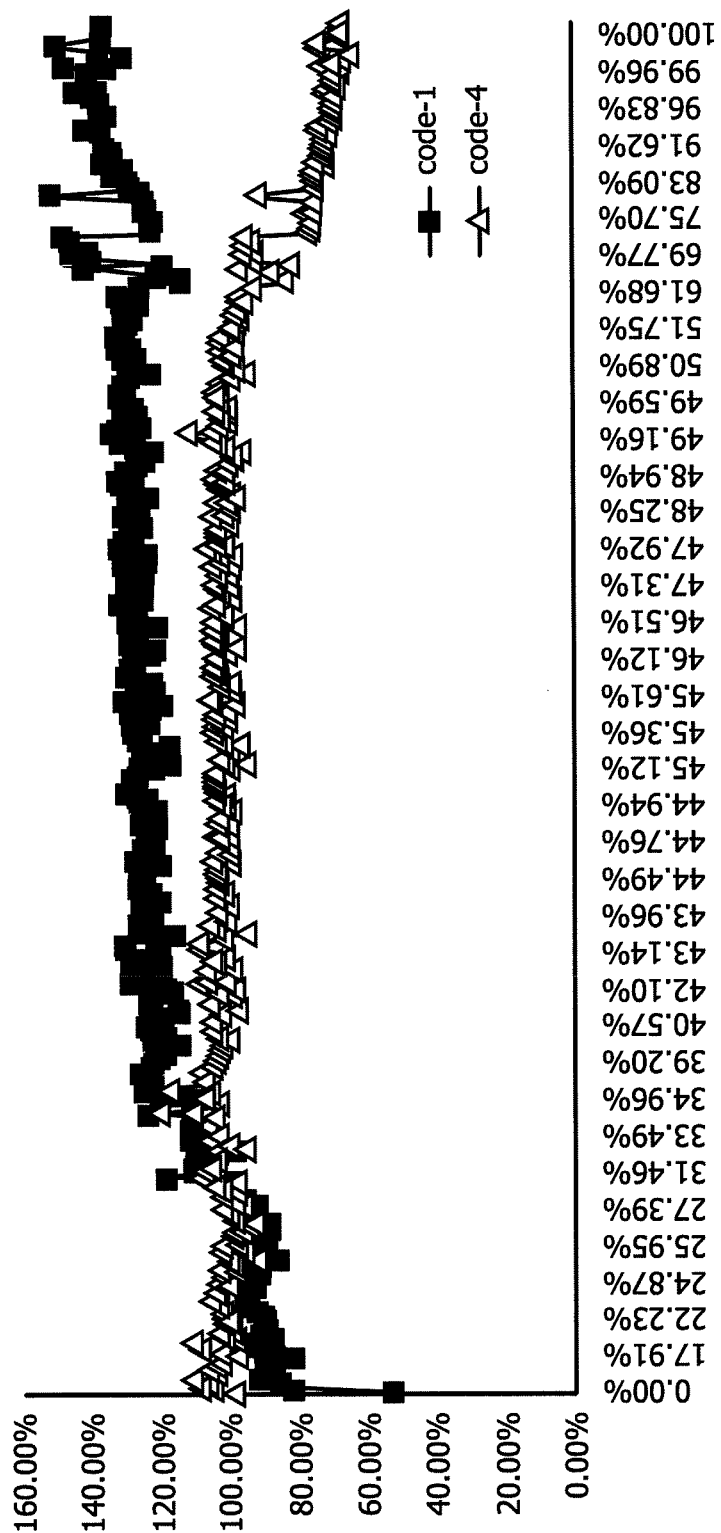
FIG. 12 is an example chart of toggling rate statistics for two different encoding schemes.

FIG. 11 is an example embodiment of a 2× clock generating circuit 1100 that generates a 2× clock signal from existing clocks by using a rising and falling edge detection circuit. The 2× clock generating circuit 1100 may include a delay circuit 1110 having as an input a 1× clock signal. The output of the delay circuit 1110 may be tied to an inverter gate 1120 and one input of an AND gate 1130. The other input of the AND gate 1130 may be tied to the 1× clock signal via an inverter gate 1140. The output of the inverter gate 1120 may be tied to one input of an AND gate 1150. The other input of the AND gate may be tied to the 1× clock signal. The output of the AND gate 1150 may be tied to one input of an OR gate 1160. The other input of the OR gate 1160 may be tied to an output of the AND gate 1130. The output of the OR gate 1160 may be the 2× clock signal.

In the embodiments described herein, the data may not be clocked if the data is the same to save power.

Described herein are different encoding methods that may be used to mitigate power consumption due to toggling rates. Table 4 shows four different encoding schemes. Table 5 shows the toggling rates at multiple interfaces in a graphics processing unit in view of different SDR, DDR and encoded DDR schemes.

TABLE 4

| definition | Code 1 | Code 2 | Code 3 | Code 4 |
|---|---|---|---|---|
| No change in signal 1 and 2 between a previous clock cycle and a current clock cycle | 00 | 00 | 01 | 00 |

TABLE 4-continued

| definition | Code 1 | Code 2 | Code 3 | Code 4 |
|---|---|---|---|---|
| Signal 1 and 2 both change between a previous clock cycle and a current clock cycle | 11 | 10 | 10 | 10 |
| Signal 1 changes between a previous clock cycle and a current clock cycle | 01 | 01 | 00 | 11 |
| Signal 2 changes between a previous clock cycle and a current clock cycle | 10 | 11 | 11 | 01 |

TABLE 5

| | SDR ave toggle rate [%] | SDR max toggle rate [%] | Sig1 + Sig2 ave toggle rate [%] | basic-DDR ave toggle rate [%] | code1-DDR ave toggle rate [%] | code2-DDR ave toggle rate [%] | code3-DDR ave toggle rate [%] | code4-DDR ave toggle rate [%] |
|---|---|---|---|---|---|---|---|---|
| PA0_SC1_Prim_SDR | 0.72 | 2.31 | 3.04 | 3.72 | 4.30 | 4.44 | 4.50 | 2.88 |
| MC_DB0_RIndexRtnData | 0.56 | 1.71 | 2.31 | 2.35 | 3.04 | 3.27 | 2.46 | 2.07 |
| SC_DB0_Tile | 0.28 | 4.13 | 4.42 | 6.06 | 8.40 | 8.36 | 6.08 | 4.48 |
| SH_DB0_Export | 1.94 | 27.07 | 29.01 | 54.32 | 54.19 | 54.18 | 54.63 | 28.80 |

Figure 14:
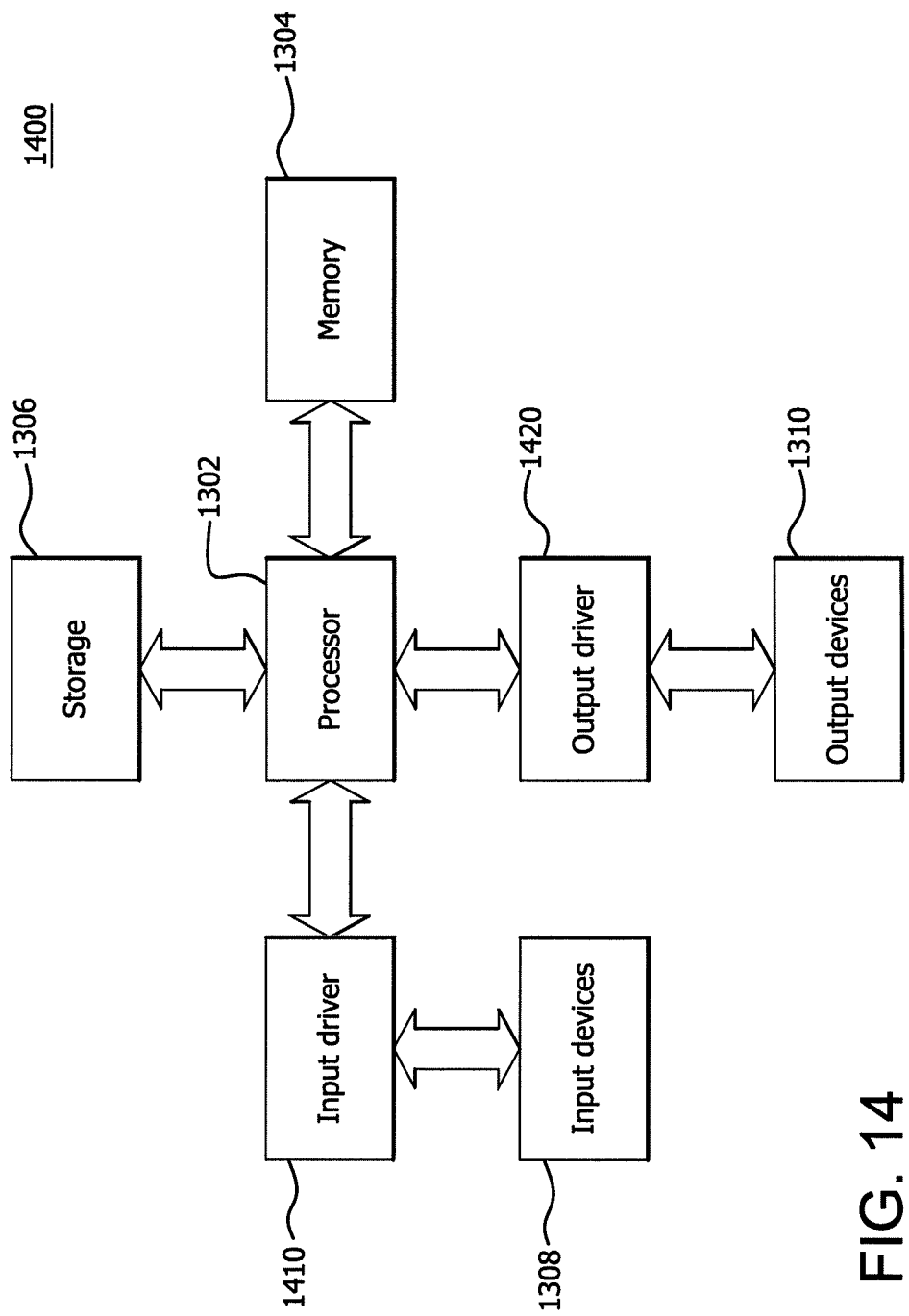
FIG. 14 is a block diagram of an alternate example device in which one or more disclosed embodiments may be implemented.

Described herein is a toggling analysis from the perspective of one interface, i.e., MC_DB0_RIndexRtnData. FIG. 14 is an example chart of toggling rate statistics for two different encoding schemes. The horizontal axis shows how different signal one and signal two are in terms of toggling rates. Restated, the "x" access is toggle rate difference and the "y" axis is how different the DDR toggling rate is from the DDR toggling rate without any encoding. For example, if there is a 100% difference on the right side of the chart, this means that one signal is not toggling at all and the other signal is toggling really fast. On the left side of the chart, if the horizontal is at 0% for the toggling rate difference, then that would mean that they are at the same toggling rate. In this chart, 100% is equivalent to having no encoding being applied. For example, 140% means that there was a 40% increase of toggling rate.

The chart shows that code number 1 is better on the left side of the chart, i.e., it is best for small toggle differences. On the right side, code 1 is actually making things worse and now code 4 is much better on the right side. That is, code 4 is best for big toggle differences. In general, by examining the statistics of both signals, an optimal code may be determined in order to minimize the toggling rate of the combined DDR signal. The lower the toggling rate, the lower the dynamic power of the circuit.

Figure 13:
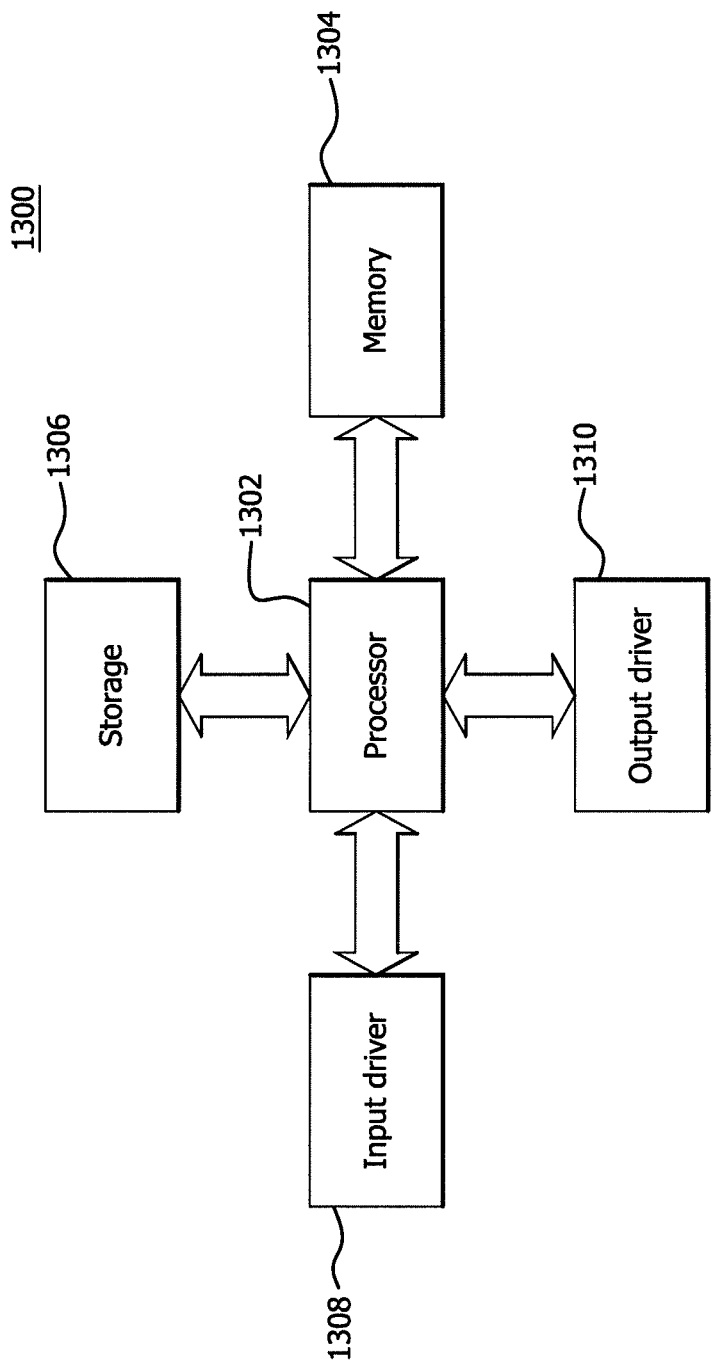
FIG. 13 is a block diagram of an example device in which one or more disclosed embodiments may be implemented.

FIG. 13 is a block diagram of an example device 1300 in which one or more disclosed embodiments may be implemented. The device 1300 may include, for example, a computer, a gaming device, a handheld device, a set-top box, a television, a mobile phone, or a tablet computer. The device 1300 includes a processor 302, a memory 104, a storage 1306, one or more input devices 1308, and one or more output devices 1310. It is understood that the device may include additional components not shown in FIG. 3.

The processor 1302 may include a central processing unit (CPU), a graphics processing unit (GPU), a CPU and GPU located on the same die, one or more processor cores, wherein each processor core may be a CPU or a GPU. The memory 1304 may be located on the same die as the processor 1302, or may be located separately from the processor 1304. The memory 1304 may include a volatile or non-volatile memory, for example, random access memory (RAM), dynamic RAM, or a cache.

The storage 1306 may include a fixed or removable storage, for example, hard disk drive, solid state drive, optical disk, or flash drive. The input devices 1308 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 1310 may include a display, a speaker, a printer, a haptic feedback device, one or more lights, an antenna, or a network connection (e.g., a wireless local area network card for transmission and/or reception of wireless IEEE 802 signals).

FIG. 14 is a block diagram of an alternate example device 1400 in which one or more disclosed embodiments may be implemented. Elements of the device 1400 which are the same as in the device 1300 are given like reference numbers. In addition to the processor 1302, the memory 1304, the storage 1306, the input devices 1308, and the output devices 1310, the device 1400 also includes an input driver 1410 and an output driver 1420.

The input driver 1410 communicates with the processor 1302 and the input devices 1308, and permits the processor 1302 to receive input from the input devices 1308. The output driver 1420 communicates with the processor 1302 and the output devices 1310, and permits the processor 1302 to send output to the output devices 1310.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Although features and elements are described above in particular combinations, each feature or element may be used alone without the other features and elements or in various combinations with or without other features and elements. The methods provided may be implemented in a general purpose computer, a processor or any IC that utilizes power gating functionality. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A circuit device, comprising:
a multiple data rate transmission circuit having at least two clocked inputs, the multiple date rate transmission circuit configured to generate a single encoded output that reduces a toggle rate between the at least two clocked inputs,
wherein the multiple data rate transmission circuit includes an encoder configured to generate an encoded output with respect to a current state and a previous state of a clocked input of the at least two clocked inputs, an another encoder configured to generate an another encoded output with respect to a current state and a previous state of another clocked input of the at least two clocked inputs and a multiplexer configured to generate the single encoded output from the encoded output and the another encoded output; and
a multiple data rate receiver circuit, wherein the multiple data rate receiver circuit is clocked to decode the at least two clocked inputs from the single encoded output.

2. The circuit device of claim 1, wherein the multiple data rate transmission circuit further comprises:
a flip-flop clocked by a first clock edge;
the encoder tied to the flip-flop, wherein the flip-flop and the encoder generate the encoded output;
another flip-flop clocked by a second clock edge;
the another encoder tied to the another flip-flop, wherein the another flip-flop and the another encoder generate the another encoded output; and
the multiplexer clocked by one of the first clock edge or the second clock edge to generate the single encoded output from the encoded output and the another encoded output.

3. The circuit device of claim 1, further comprises: a multiple data rate repeater circuit, wherein the multiple data rate repeater circuit comprises:
a first flip-flop clocked by a first clock edge;
a second flip-flop clocked by a second clock edge; and
a multiplexer clocked by one of the first clock edge or the second clock edge, the first flip-flop, second flip-flop and multiplexer configured to retransmit the single encoded output.

4. The circuit device of claim 1, further comprises: a multiple data rate repeater circuit, wherein the multiple data rate transmission circuit is clocked at a clock rate, the multiple data rate repeater circuit comprises:
a flip-flop clocked at twice the clock rate, the flip-flop configured to retransmit the single encoded output.

5. The circuit device of claim 1, further comprises:
a multiple data rate repeater circuit coupled to the multiple data rate transmission circuit by a wire, wherein the multiple data rate repeater circuit is clocked to retransmit the single encoded output.

6. The circuit device of claim 5, wherein the multiple data rate receiver circuit is coupled to the multiple data rate repeater circuit by another wire, wherein the multiple data rate receiver circuit comprises:
a first set of flip-flops having a first flip-flop clocked by a first clock edge and a second flip-flop clocked by a second clock edge; and
a second set of flip-flops tied to the first set of flip-flops, the second set of flip-flops having a first flip-flop and a second flip-flop clocked by one of the first clock edge or the second clock edge,
wherein the first set of flip-flops and the second set of flip-flops are configured to generate the at least two clocked inputs from the single encoded output.

7. The circuit device of claim 1, wherein the multiple data rate transmission circuit is clocked at a clock rate, the multiple data rate receiver circuit comprises:
a first flip-flop and a second flip-flop clocked at twice the clock rate, the first flip-flop and the second flip-flop configured to generate the at least two clocked inputs from the single encoded output.

8. The circuit device of claim 1, further comprising:
a source synchronous bus configured to transmit a clocking signal to the multiple data rate transmission circuit, a multiple data rate repeater circuit, and the multiple data rate receiver circuit via wires; and
a phase correction circuit tied to the multiple data rate receiver circuit, the phase correction circuit configured to correct a phase difference resulting from traveling over the source synchronous bus, the phase correction circuit being applied to at least two decoded outputs of the multiple data rate receiver circuit.

9. The circuit device of claim 1, further comprising:
a clock gate circuit tied to the multiple data rate transmission circuit, wherein a clocking signal is transmitted responsive to a valid input with respect to the at least two clocked inputs.

10. The circuit device of claim 1, further comprising:
the multiple data rate transmission circuit being clocked at a clock rate; and
a multiple data rate repeater circuit and the multiple data rate receiver circuit being clocked at twice the clock rate.

11. A method for interconnecting, comprising:
providing a multiple data rate transmission circuit that generates a single encoded output responsive to at least two clocked inputs, the single encoded output reducing a toggle rate between the at least two clocked inputs, wherein a clocking signal is received by the multiple data rate transmission circuit on a condition that a valid input is received at a clock gate with respect to the at least two clocked inputs;
generating an encoded output with respect to a current state and a previous state of a clocked input of the at least two inputs;
generating another encoded output with respect to a current state and a previous state of another clocked input of the at least two clocked inputs; and
generating the single encoded output from the encoded output and the another encoded output.

12. The method of claim 11, further comprising:
providing a multiple data rate repeater circuit interconnected to the multiple data rate transmission circuit by a wire, wherein the multiple data rate repeater circuit is clocked to retransmit the single encoded output;

providing a multiple data rate receiver circuit interconnected to the multiple data rate repeater circuit by another wire, wherein the multiple data rate receiver circuit is clocked to decode the at least two clocked inputs from the single encoded output; and transmitting the single encoded output to the multiple data rate repeater circuit and to the multiple data rate receiver circuit via wires.

13. The method of claim 11, further comprising:
regenerating, at a multiple data rate receiver circuit, the single encoded output from a clocked single encoded input.

14. The method of claim 11, further comprising:
clocking the multiple data rate transmission circuit at a clock rate; and
clocking a multiple data rate repeater circuit and a data rate receiver circuit at twice the clock rate.

15. The method of claim 11, further comprising:
generating, at a multiple data rate receiver, the at least two clocked inputs from a clocked single encoded input.

16. The method of claim 11, further comprising:
sending a clocking signal over a source synchronous bus to the multiple data rate transmission circuit, a multiple data rate repeater circuit, and a multiple data rate receiver circuit via wires; and
correcting a phase difference resulting from traveling over the source synchronous bus, the phase correction circuit being applied to at least two decoded outputs of the multiple data rate receiver circuit.

17. A system, comprising:
a multiple data rate transmitter having at least two clocked inputs, the multiple date rate transmitter configured to generate a single encoded output that reduces a toggle rate between the at least two clocked inputs;
a multiple data rate repeater interconnected to the multiple data rate transmitter by a wire, wherein the multiple data rate repeater is clocked to retransmit the single encoded output;
a multiple data rate receiver interconnected to the at least one multiple data rate repeater by another wire, wherein the multiple data rate receiver is clocked to decode the at least two clocked inputs from the single encoded output;
a source synchronous bus configured to transmit a clocking signal to the multiple data rate transmitter, multiple data rate repeater, and the multiple data rate receiver via wires; and
a phase corrector circuit tied to the multiple data rate receiver, the phase corrector configured to correct a phase difference resulting from traveling over the source synchronous bus, the phase corrector being applied to at least two decoded outputs of the multiple data rate receiver circuit.

18. The system of claim 17, further comprising:
the multiple data rate transmitter being clocked at a clock rate; and
the multiple data rate repeater and the multiple data rate receiver being clocked at twice the clock rate.

* * * * *